United States Patent
Li et al.

(10) Patent No.: US 11,121,215 B2
(45) Date of Patent: Sep. 14, 2021

(54) IFINFET

(71) Applicant: International Business Machines Corporation, Armonk, NY (US)

(72) Inventors: Juntao Li, Cohoes, NY (US); Kangguo Cheng, Schenectady, NY (US); Chen Zhang, Albany, NY (US); Xin Miao, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/677,723

(22) Filed: Nov. 8, 2019

(65) Prior Publication Data

US 2020/0075721 A1    Mar. 5, 2020

Related U.S. Application Data

(62) Division of application No. 15/844,725, filed on Dec. 18, 2017.

(51) Int. Cl.
| | |
|---|---|
| H01L 29/06 | (2006.01) |
| H01L 29/66 | (2006.01) |
| H01L 29/423 | (2006.01) |
| H01L 29/78 | (2006.01) |
| H01L 29/161 | (2006.01) |
| B82Y 10/00 | (2011.01) |

(Continued)

(52) U.S. Cl.
CPC .......... *H01L 29/0673* (2013.01); *B82Y 10/00* (2013.01); *H01L 29/0653* (2013.01); *H01L 29/161* (2013.01); *H01L 29/401* (2013.01); *H01L 29/42392* (2013.01); *H01L 29/6656* (2013.01); *H01L 29/66439* (2013.01); *H01L 29/66545* (2013.01); *H01L 29/66553* (2013.01); *H01L 29/66795* (2013.01); *H01L 29/775* (2013.01); *H01L 29/785* (2013.01); *H01L 29/66469* (2013.01)

(58) Field of Classification Search
CPC ........... H01L 29/0673; H01L 29/66439; H01L 29/785; H01L 29/42392; H01L 29/6556
See application file for complete search history.

(56) References Cited

U.S. PATENT DOCUMENTS

| | | |
|---|---|---|
| 9,263,338 B2 | 2/2016 | Liu et al. |
| 9,590,038 B1 | 3/2017 | Kim et al. |
| 9,620,607 B2 | 4/2017 | Huang et al. |

(Continued)

OTHER PUBLICATIONS

List of IBM Patents or Patent Applications Treated As Related; (Appendix P); Date Filed: Nov. 8, 2019, 2 pages.

(Continued)

*Primary Examiner* — Thanhha S Pham
(74) *Attorney, Agent, or Firm* — Cantor Colburn LLP; Randall Bluestone

(57) ABSTRACT

A technique relates to a semiconductor device. A stack includes two or more nanowires separated by a high-k dielectric material, the high-k dielectric material being formed on at least a center portion of the two or more nanowires in the stack. A separation space between the two or more nanowires is less than two times a thickness of the high-k dielectric material formed on a side wall of the two or more nanowires. A source or a drain formed on sides of the stack.

20 Claims, 15 Drawing Sheets

Fin cross sectional view

Gate cross sectional view

(51) Int. Cl.
*H01L 29/775* (2006.01)
*H01L 29/40* (2006.01)

(56) References Cited

U.S. PATENT DOCUMENTS

| | | |
|---|---|---|
| 9,660,033 B1 | 5/2017 | Chen et al. |
| 9,716,145 B2 | 7/2017 | Balakrishnan et al. |
| 10,497,624 B2 | 12/2019 | Yu et al. |
| 2015/0144880 A1* | 5/2015 | Rachmady ........ H01L 29/78618 257/24 |
| 2016/0240681 A1 | 8/2016 | Ching et al. |
| 2017/0005195 A1 | 1/2017 | Ching et al. |
| 2017/0125300 A1 | 5/2017 | Kim |
| 2017/0154973 A1 | 6/2017 | Ching et al. |
| 2017/0250291 A1* | 8/2017 | Lee .................... H01L 29/0665 |
| 2018/0190829 A1* | 7/2018 | Song ................... H01L 29/0673 |
| 2019/0067441 A1* | 2/2019 | Yang ................... H01L 29/1079 |
| 2019/0189739 A1 | 6/2019 | Li et al. |

OTHER PUBLICATIONS

P. Zheng et al., "Inserted-oxide FinFET (iFinFET) design to extend CMOS scaling," International Symposium on VLSI Technology, Systems and Application (VLSI-TSA), 2015. IEEE, 2 pages.

P. Zheng et al., "Simulation-based study of the inserted-oxide FinFET for future low-power system-on-chip applications," IEEE Electron Device Letters, vol. 36, No. 8, 2015, pp. 742-744.

R. Singh et al., "Analytical Modeling of Parasitic Capacitance in Inserted-Oxide FinFETs," IEEE Transactions on Electron Devices, 2017.

* cited by examiner

Gate cross sectional view

Fin cross sectional view

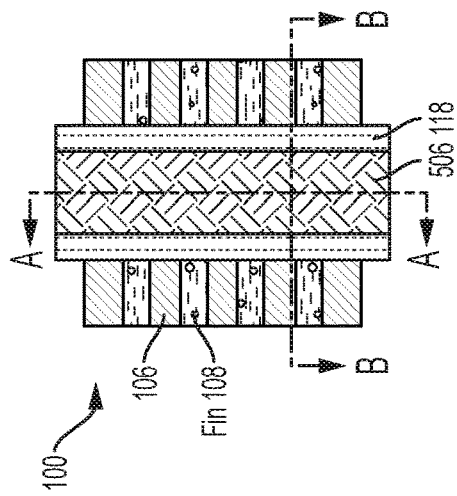
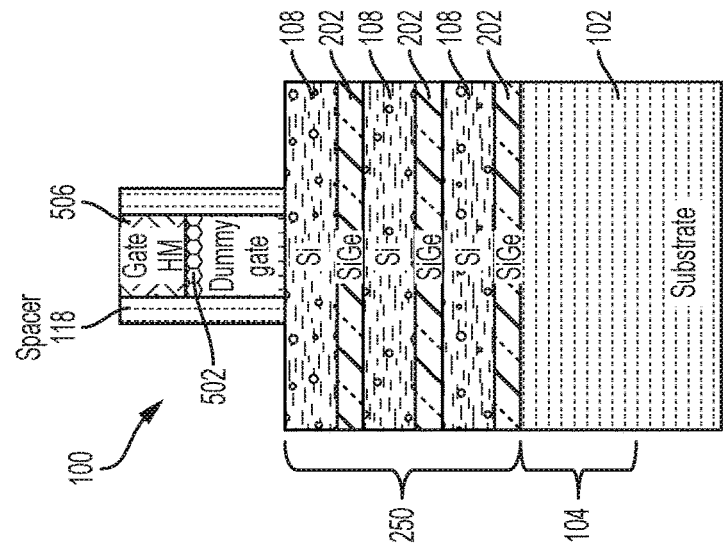
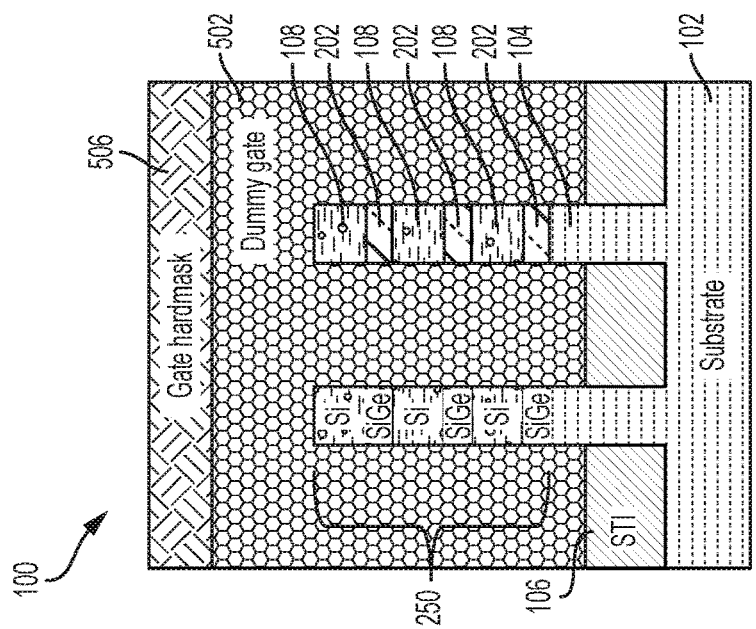

Gate cross sectional view

Fin cross sectional view

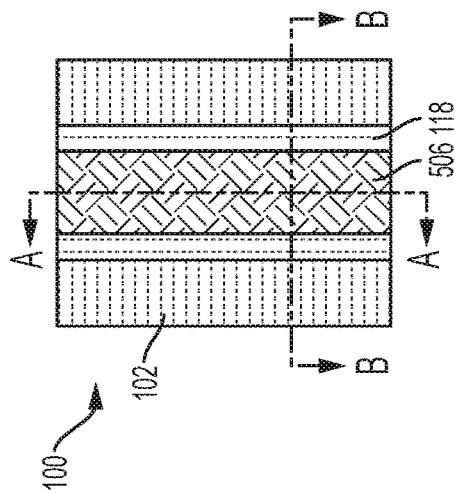
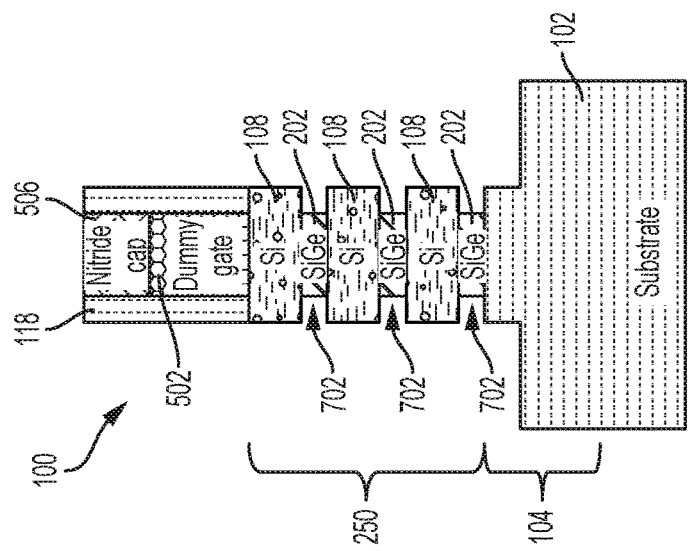
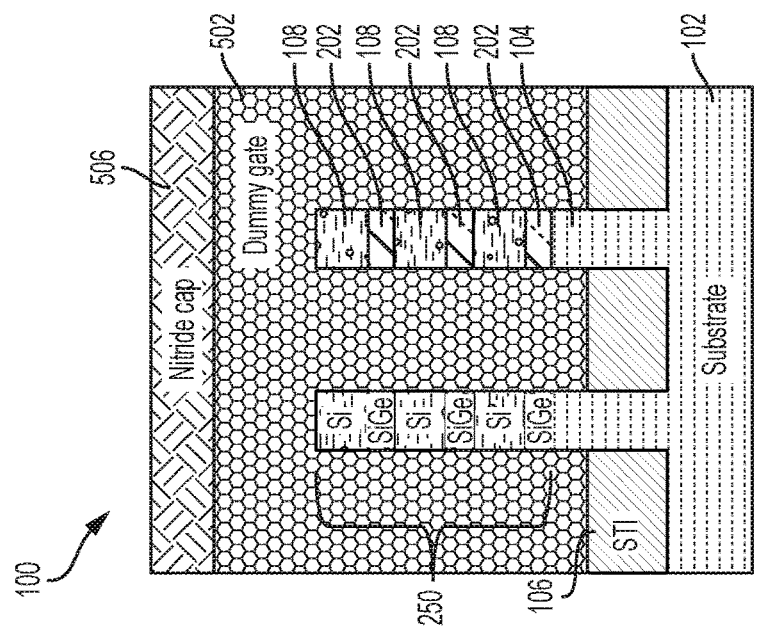
FIG. 7C
FIG. 7B
FIG. 7A

Gate cross sectional view

Fin cross sectional view

Gate cross sectional view

Fin cross sectional view

Gate cross sectional view

Fin cross sectional view

Gate cross sectional view

Fin cross sectional view

Gate cross sectional view

Fin cross sectional view

FIG. 13   1300

FORM A STACK COMPRISING TWO OR MORE NANOWIRES SEPARATED BY A HIGH-K DIELECTRIC MATERIAL, THE HIGH-K DIELECTRIC MATERIAL FORMED ON AT LEAST A CENTER PORTION OF THE TWO OR MORE NANOWIRES IN THE STACK, WHEREIN A SEPARATION SPACE BETWEEN THE TWO OR MORE NANOWIRES IS LESS THAN TWO TIMES A THICKNESS OF THE HIGH-K DIELECTRIC MATERIAL FORMED ON A SIDE WALL OF THE TWO OR MORE NANOWIRES 1302

FORM A SOURCE/DRAIN ON SIDES OF THE STACK 1304

FORM AN INNER SPACER TO SEPARATE THE SOURCE/DRAIN FROM THE HIGH-K DIELECTRIC MATERIAL 1306

IFINFET

DOMESTIC PRIORITY

This application is a divisional of U.S. patent application Ser. No. 15/844,725, filed Dec. 18, 2017, the disclosure of which is incorporated by reference herein in its entirety.

BACKGROUND

The present invention generally relates to semiconductor devices, and more specifically, to improved inserted-oxide fin field effect transistors (iFinFET) devices.

The FinFET multi-gate transistor structure is widely used in 14/16 nanometer (nm) generation complementary metal-oxide-semiconductor (CMOS) technologies. To enable ultimate gate-length scaling, gate-all-around (GAA) field effect transistors (FET) have been developed. Although the GAA FET structure can provide superior electrostatics, it comes with process challenges such as forming spacers and filling gate metal between nanowires. Inserted-oxide fin field effect transistors (iFinFET) have been proposed to achieve a trade-off between process challenges and electrostatics.

SUMMARY

Embodiments of the invention are directed to a semiconductor device. A non-limiting example of the semiconductor device includes a stack having two or more nanowires separated by a high-k dielectric material, the high-k dielectric material being formed on at least a center portion of the two or more nanowires in the stack. A separation space between the two or more nanowires is less than two times a thickness of the high-k dielectric material formed on a side wall of the two or more nanowires. The semiconductor device includes a source or a drain formed on sides of the stack.

Embodiments of the invention are directed to a method for fabricating a semiconductor device. A non-limiting example of the method includes forming a stack including two or more nanowires separated by a high-k dielectric material, the high-k dielectric material being formed on at least a center portion of the two or more nanowires in the stack. A separation space between the two or more nanowires is less than two times a thickness of the high-k dielectric material formed on a side wall of the two or more nanowires. The method includes forming a source or a drain on sides of the stack Embodiments of the invention are directed to a method for fabricating a semiconductor device. A non-limiting example of the method includes forming a stack having alternating layers of nanowire layers and sacrificial layers on a substrate, forming a dummy gate on the stack, forming a cap layer on top of the dummy gate, and recessing part of the nanowire layers and the sacrificial layers in the stack. Also, the method includes forming a source or a drain on sides of the stack, laterally etching the sacrificial layers to remove parts of the sacrificial layers such that spaces remain in the stack at areas in which the parts of the sacrificial layers have been removed, and forming an inner spacer material on side portions of the sacrificial layers in the spaces left in the stack. Further, the method includes removing the dummy gate and the cap layer, removing the sacrificial layers to form gaps at locations in which the sacrificial layers are removed, such that the nanowire layers are suspended in air over the gaps, and depositing a high-k dielectric material at least in the gaps, where a thickness of each of the sacrificial layers is less than two times a thickness of the high-k dielectric material formed on side walls of the nanowire layers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5A depicts a cross-sectional view of the semiconductor device along line A-A of FIG. 5C according to embodiments of the invention;

FIG. 5B depicts a cross-sectional view of the semiconductor device along line B-B of FIG. 5C according to embodiments of the invention;

FIG. 5C depicts a top view of the semiconductor device according to embodiments of the invention;

FIG. 7A depicts a cross-sectional view of the semiconductor device along line A-A of FIG. 7C according to embodiments of the invention;

FIG. 7B depicts a cross-sectional view of the semiconductor device along line B-B of FIG. 7C according to embodiments of the invention;

FIG. 7C depicts a top view of the semiconductor device according to embodiments of the invention;

FIG. 13 depicts a flow chart of a method of fabricating a semiconductor device according to embodiments of the invention;

Figure 1C:
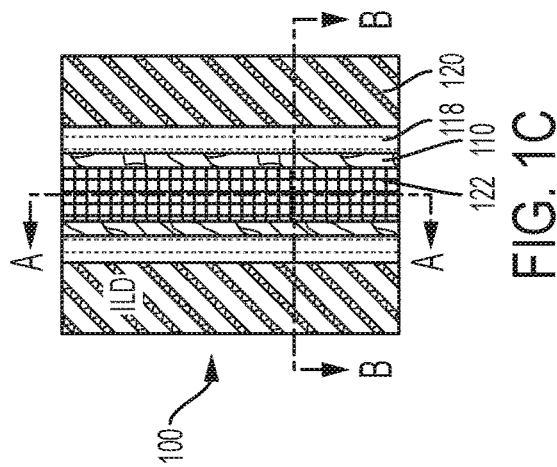
FIG. 1C depicts a top view of the semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, although gate-all-around (GAA) FET structures can provide superior electrostatics, it comes with process challenges such as forming spacers and filling gate metal between nanowires. Inserted-oxide FinFET (iFinFET) has been proposed to achieve a trade-off between process challenges and electrostatics. One challenge with iFinFET is the difficulty in forming the semiconductor/insulator stack. State-of-the-art approaches require multiple paths of wafer bonding which renders the iFinFET impractical for manufacturing. Accordingly, there is a need to optimize the iFinFET integration process.

Turning now to an overview of the aspects of the invention, one or more embodiments of the invention address the above-described shortcomings of the prior art by providing a semiconductor device and a method of forming the semiconductor device. The semiconductor device is an improved iFinFET. The above-described aspects of the invention address the shortcomings of the prior art by having a sacrificial layer (e.g., SiGe) thickness that is less than twice (2 times or 2×) the thickness for the high-k dielectric material deposited in the replace metal gate process. After removing the dummy gate, the sacrificial layer (e.g., SiGe) is removed, which leaves spaces/gaps between adjacent nanowire (e.g., Si) fin segments. High-k gate dielectric deposition results in pinch-off of the high-k dielectric material between adjacent nanowire (Si) fin segments to form the iFinFET. High-k dielectric material enhances the coupling of the metal gate to nanowire (Si) fin segment, resulting in a further improvement in electrostatics of the iFinFET. The high-k dielectric material completely wraps around the nanowire fin segments.

Figure 1B:
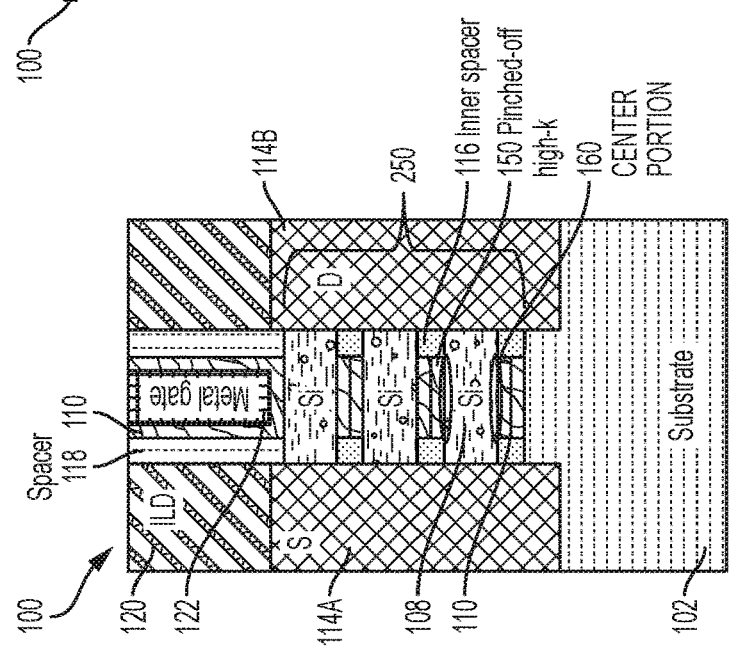
FIG. 1B depicts a cross-sectional view of the semiconductor device along line B-B of FIG. 1C according to embodiments of the invention.
Figure 1A:
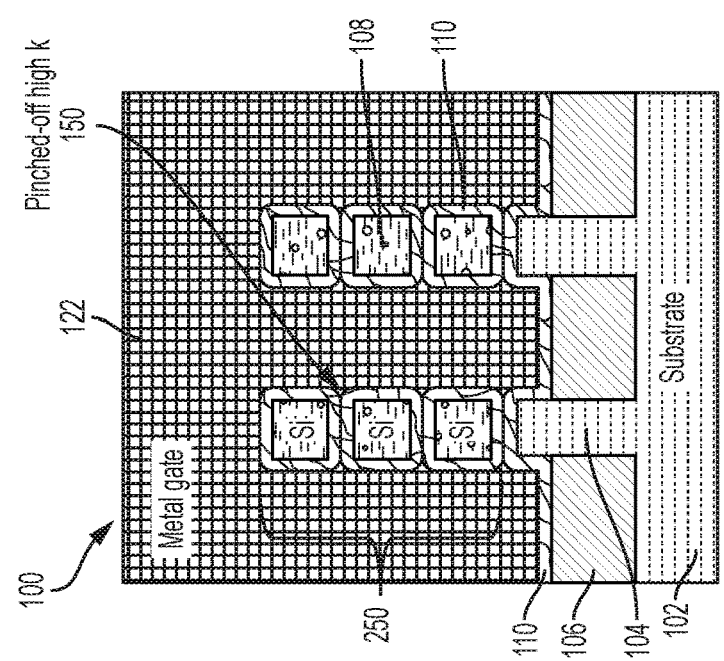
FIG. 1A depicts a cross-sectional view of a semiconductor device along line A-A of FIG. 1C according to embodiments of the invention.

Turning now to a more detailed description of aspects of the present invention, FIG. 1A depicts a cross-sectional view of a semiconductor device 100 along line A-A of FIG. 1C according to embodiments of the invention. FIG. 1B depicts a cross-sectional view of the semiconductor device 100 along line B-B of FIG. 1C according to embodiments of the invention. FIG. 1C depicts a top view of the semiconductor device 100 according to embodiments of the invention. As can be seen, FIG. 1A is a fin cross-sectional view and FIG. 1B is a gate cross-sectional view of the semiconductor device 100. The semiconductor device 100 is an iFinFET.

The semiconductor device 100 has one or more fins 104, shallow trench isolation (STI) material 106 formed on the substrate 102, nanowires 108 separated by high-k material 110, and inner spacers 116. The semiconductor device 100 includes a source 114A and drain 114B, inter-layer dielectric (ILD) material 120, a spacer 118, and a metal gate 122. There is a pinch-off 150 of high-k dielectric material 110 between the nanowires 108. FIG. 1B shows that the high-k dielectric material 110 is formed on center portions 160 of the nanowires 108, while the inner spacers 116 are formed on side portions of the nanowires 108. The nanowires 108, high-k dielectric material 110, and inner spacers 116 form stack 250.

Figure 2:
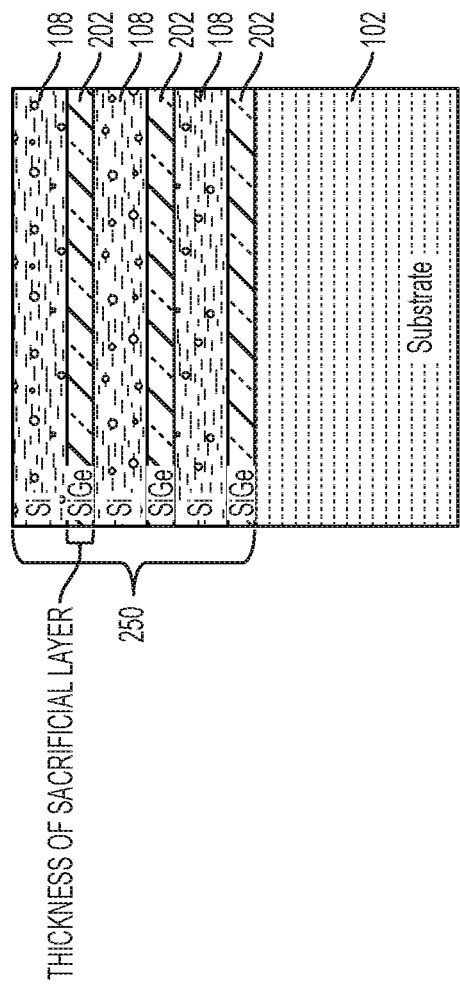
FIG. 2 depicts a cross-sectional view of the semiconductor device according to embodiments of the invention.

An example fabrication process for forming the semiconductor device 100 is discussed below. FIG. 2 depicts a cross-sectional view of the semiconductor device 100 according to embodiments of the invention. The structure for the semiconductor device 100 includes the substrate 102. Sacrificial layers 202 and nanowire layer 108 are alternatingly deposited on the substrate 102. For explanation purposes, the substrate 102 can be a silicon (Si) layer, the sacrificial layers 202 can be silicon germanium (SiGe) layers, and the nanowire layers 108 can be Si. The material of the sacrificial layer 202 is to have a property of being selectively etched in comparison to material of the substrate 102 and nanowire layer 108. The alternating sacrificial layers 202 and nanowire layers 108 (Si and SiGe layers) overlying the substrate 102 produce a layered stack 250. The alternating SiGe and Si layers can be formed, for example, by alternating SiGe and Si epitaxy growth. Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

The substrate 102 can encompasses semiconductor materials conventionally used in the semiconductor industry from which to make electrical devices. In embodiments of the invention, the starting substrate can be a semiconductor-on-insulator (SOI) substrate, which already includes the buried oxide layer. Alternatively, the starting substrate can be a bulk semiconductor including a sole semiconductor material or a combination of two or more semiconductor materials. The semiconductor material can include one or more monocrystalline silicon materials, such as the relatively pure or lightly impurity-doped monocrystalline silicon materials typically used in the semiconductor industry, as well as polycrystalline silicon materials, wherein silicon can be mixed with other elements such as carbon and the like. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. The semiconductor material also includes other materials such as relatively pure and impurity-doped gallium arsenide, germanium, gallium arsenide, gallium nitride, cadmium telluride, and zinc selenide, zinc oxide, glass, and the like. The substrate 102 can be a monocrystalline silicon material. The silicon substrate 102 can be a bulk silicon wafer or can be a thin layer of silicon disposed over an insulating layer (SOI) that, in turn, can be supported by a carrier wafer. The substrate 102 can be material consisting essentially of III-V compound semiconductors. Other suitable substrates include II-VI compound.

Example materials for the nanowire layers 108 can include silicon. The nanowire layers 108 can be doped or undoped. When doped, the nanowire layers can include "P" type dopants such as boron, aluminum, gallium, and indium, or "N" type dopants such as phosphorus, arsenic, antimony. Other materials or combinations of materials can also be used. Other non-limiting examples of semiconductor materials for the nanowire layers 108 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Example materials for the sacrificial layers 202 can include silicon germanium. Other non-limiting examples of semiconductor materials for the sacrificial layers 202 include Si (silicon), strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof. In some embodiments of the invention, the thickness of the nanowire layers 108 can be about 5 nm to about 20 nm thick, while the thickness of the sacrificial layers 202 can be about 2 nm to about 6 nm thick. In some embodiments of the invention, the thickness of the nanowire layers 108 can be between about 10 nm to about 12 nm and the sacrificial layers 202 can be about 3 nm to about 5 nm. Greater and smaller thicknesses are also contemplated. It should be noted that the thickness of each sacrificial layer 202 is to be less than twice (2 times) the thickness of the final high-k dielectric layer 110, as discussed further herein. The thickness of the sacrificial layer 202 (e.g., SiGe) can be about 3 to 4 nanometers (nm). The thickness of thin sacrificial layer 202 (e.g., SiGe) is to be less than a critical thickness which avoids epitaxy defect problems. Nanowire and nanosheet transistor devices can be created using silicon germanium as a sacrificial layer formed between layers of silicon. However, due to the lattice mismatch between silicon germanium crystals and silicon crystals, a strain is formed in the sacrificial silicon germanium layers. When the silicon germanium layers are formed to a thickness that is greater than a critical thickness, defects such as dislocations are formed in the stack. In some embodiments of the invention, the sacrificial layers 202 (e.g., SiGe) can be formed from a mixture of silicon and germanium that can be deposited by epitaxial growth with a mixture of silane and germane such that the sacrificial layers 202 have a monocrystalline structure. In embodiments of the invention, the SiGe fin layer 104 can be about 10 to about 90 mole % germanium, and about 10 to about 90 mole % silicon. In some embodiments invention, the SiGe fin layer 104 can be about 10 to about 50 mole % germanium and about 50 to about 90 mole % silicon, and/or about 15 to about 30 mole % germanium and about 70 to about 85 mole % silicon.

Figure 3C:
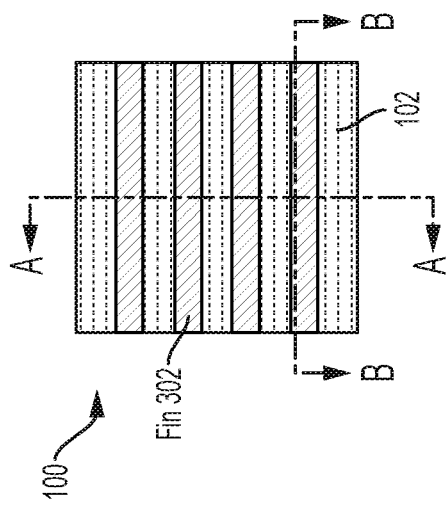
FIG. 3C depicts a top view of the semiconductor device according to embodiments of the invention.
Figure 3B:
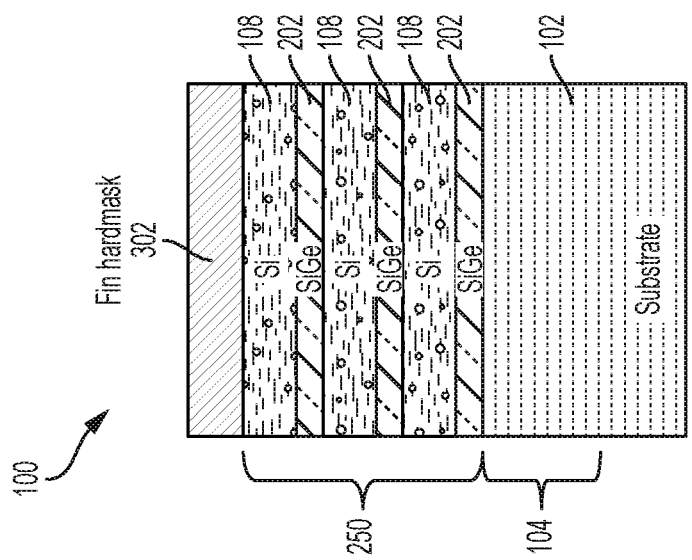
FIG. 3B depicts a cross-sectional view of the semiconductor device along line B-B of FIG. 3C according to embodiments of the invention.
Figure 3A:
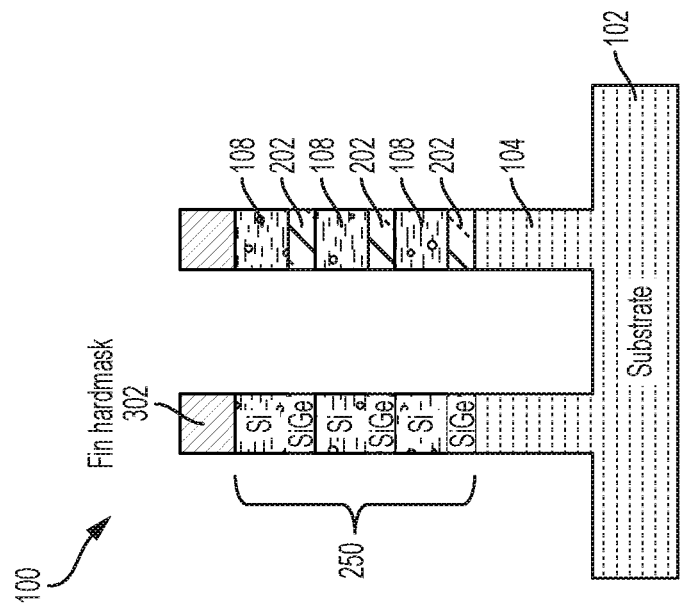
FIG. 3A depicts a cross-sectional view of the semiconductor device along line A-A of FIG. 3C according to embodiments of the invention.

FIG. 3A depicts a cross-sectional view of a semiconductor device 100 along line A-A of FIG. 3C according to embodiments of the invention. FIG. 3B depicts a cross-sectional view of the semiconductor device 100 along line B-B of FIG. 3C according to embodiments of the invention. FIG. 3C depicts a top view of the semiconductor device 100 according to embodiments of the invention.

The structure of the semiconductor device 100 is patterned to form the fins 104. Etching is used to pattern the fins 104 as understood by one skilled in the art. Sidewall image transfer (SIT) or reactive ion etching (RIE) can be utilized to form the fins 104. A fin hardmask 302 is formed on top of stack 250 of the semiconductor device 100, such as, for example, on top of the top nanowire layer 108. The hardmask 302 can, for example, include silicon nitride, which can be deposited by chemical vapor deposition (CVD) or any other suitable deposition techniques, but other materials available in the art can be used in some embodiments of the invention. While it is contemplated that the hardmask 302 can be formed from silicon nitride, it should be understood that alternative hardmask materials can include silicon oxides, silicon oxynitrides, silicon carbides, silicon carbonitrides, etc. Spin-on dielectrics can also be utilized as a hardmask material including, but not limited to, silsequioxanes, siloxanes, and boron phosphate silicate glass (BPSG). After patterning, the stack 250 becomes a layered fin and portions of the substrate 102 are exposed. It should be noted that the widths of the hardmasks 302 define the width of fins 104. In particular, controlling the widths of the hardmasks 302 determines whether the fins 104 form nanowires or nanosheets. It should be understood that nanowires have a width-to-thickness ratio that is about 2:1 or less, while nanosheets have a width-to-thickness ratio that is about 2:1 or greater. Nanowires will be shown and discussed herein, but the present principles and processes apply with equal effect to nanosheets.

Alternative processes for patterning the fins 104 can include, for example, a sidewall image transfer process or SIT. SIT is useful for scaling purposes as it can be used to achieve sub-lithographic fin pitches. As is known in the art, SIT involves first patterning a mandrel (not shown) on the wafer, and then forming spacers (not shown) on opposite sides of the mandrel. The mandrel is removed selective to the spacers, and the spacers are used to pattern fins in the wafer. Thus, the pitch of the fins is doubled as compared to the pitch of the patterned mandrels.

Figure 4C:
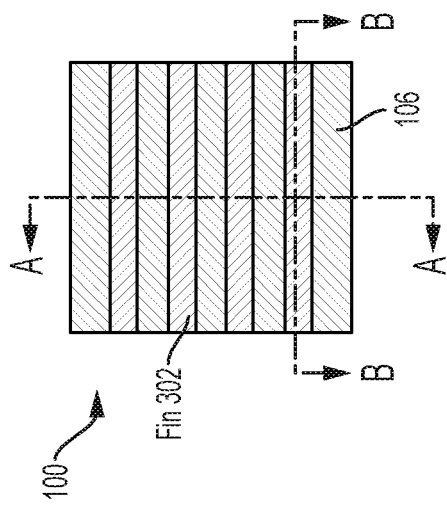
FIG. 4C depicts a top view of the semiconductor device according to embodiments of the invention.
Figure 4B:
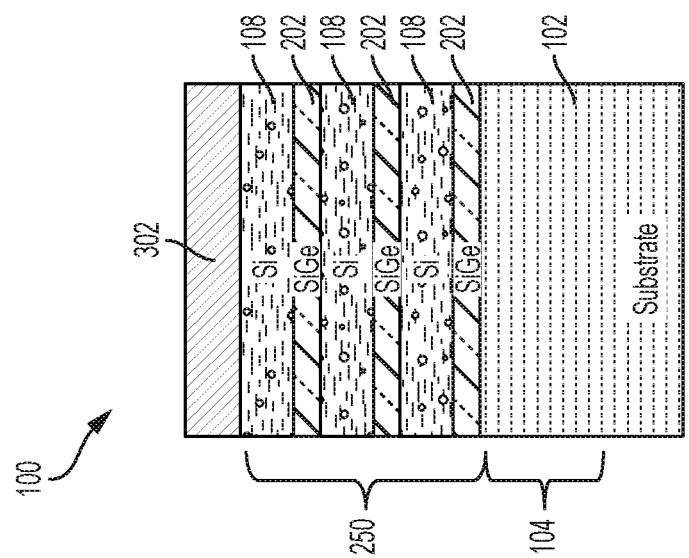
FIG. 4B depicts a cross-sectional view of the semiconductor device along line B-B of FIG. 4C according to embodiments of the invention.
Figure 4A:
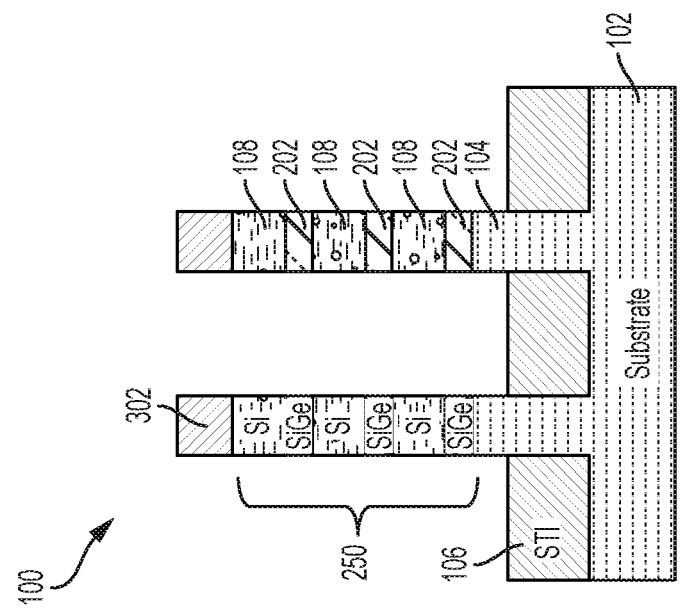
FIG. 4A depicts a cross-sectional view of the semiconductor device along line A-A of FIG. 4C according to embodiments of the invention.

FIG. 4A depicts a cross-sectional view of a semiconductor device 100 along line A-A of FIG. 4C according to embodiments of the invention. FIG. 4B depicts a cross-sectional view of the semiconductor device 100 along line B-B of FIG. 4C according to embodiments of the invention. FIG. 4C depicts a top view of the semiconductor device 100 according to embodiments of the invention. The semiconductor device 100 shows formation of the STI material 106. For example, the STI material 106 is deposited, and the STI material 106 is recessed to expose portions of the fin 104. Exposed portions of the fins 104 are above the STI material 106. The STI material 106 can be an oxide material, for example, such as silicon oxide.

FIG. 5A depicts a cross-sectional view of a semiconductor device 100 along line A-A of FIG. 5C according to embodiments of the invention. FIG. 5B depicts a cross-sectional view of the semiconductor device 100 along line B-B of FIG. 5C according to embodiments of the invention. FIG. 5C depicts a top view of the semiconductor device 100 according to embodiments of the invention. The fin hardmask 302 has been removed from the semiconductor device 100. A dummy gate 502 is formed on the layers 108 and 202 of the stack 250, and a gate hardmask 506 (e.g., nitride cap) is formed on top of the dummy gate 502. Spacer 118 is formed on sides of the dummy gate 502 and the gate hardmask 506. The dummy gate 502 can be amorphous carbon. Other example materials of the dummy gate 502 can include amorphous silicon, polysilicon, etc. The gate hardmask 506 can be silicon nitride or silicon oxygen nitride (SiON). Other materials for the dummy gate hardmask 506 can include silicon oxides, silicon oxynitrides, silicon carbides, silicon carbonitrides, etc. Spin-on dielectrics can also be utilized as a hardmask material including, but not limited to: silsequioxanes, siloxanes, and boron phosphate silicate glass (BPSG). In some embodiments of the invention, the dummy gate hardmask 506 can be formed from more than one layer of materials. For example, gate hardmask 506 can include a silicon oxide layer on top of a silicon nitride layer. Materials of the spacer 118 can include silicon nitride (SiN), silicon oxynitride (SiON), silicon oxycarbon nitride (SiOCN), silicon boron carbon nitride (SiBCN), silicon carbide (SiC), and silicon carbon nitride (SiCN).

Various types of deposition techniques can be utilized. For example, chemical vapor deposition (CVD), physical vapor deposition (PVD), atomic layer deposition (ALD) or gas cluster ion beam (GCM) deposition can be used to deposit the dummy gate 502. The gate hardmask 506 can be formed from silicon nitride deposited by CVD, but any appropriate dielectric material and deposition process can be employed instead. In some embodiments of the invention, the dummy gate hardmask 506 can be formed by blanket depositing of a layer of hardmask material via CVD, providing a patterned photoresist on top of the layer of hardmask material, and then etching the layer of hardmask material to provide the dummy gate hardmask 506. The dummy gate 502 can be patterned by any suitable patterning techniques, including but not limited to, lithography followed by directional etch (e.g., reactive ion etch (RIE)), sidewall imaging transfer, and self-aligned double or quadruple patterning. Spacer material 118 is blanket deposited over any exposed structures, including the dummy gate 502 and gate hardmask 506. The spacer material 118 can be, deposited using a conformal deposition process, such as, e.g., CVD or ALD. The spacer material 118 can be deposited to a thickness of about 3 nm to 15 nm for 14 nm technology node and beyond.

Figure 6C:
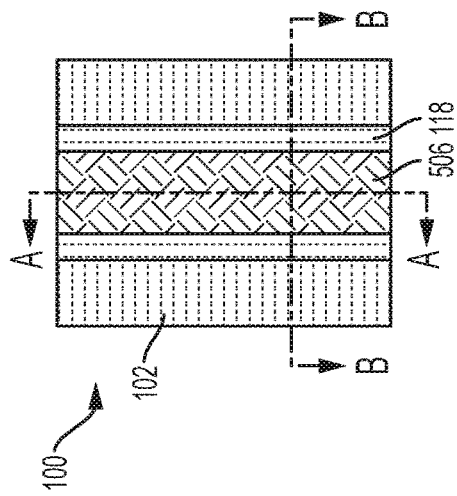
FIG. 6C depicts a top view of the semiconductor device according to embodiments of the invention.
Figure 6B:
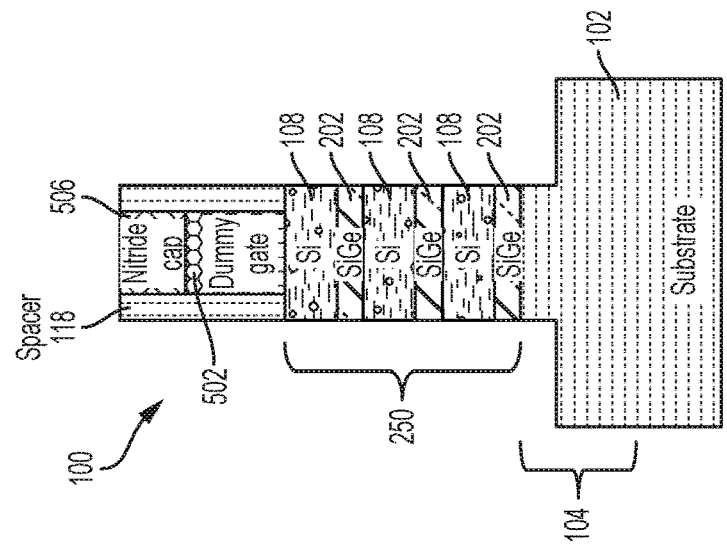
FIG. 6B depicts a cross-sectional view of the semiconductor device along line B-B of FIG. 6C according to embodiments of the invention.
Figure 6A:
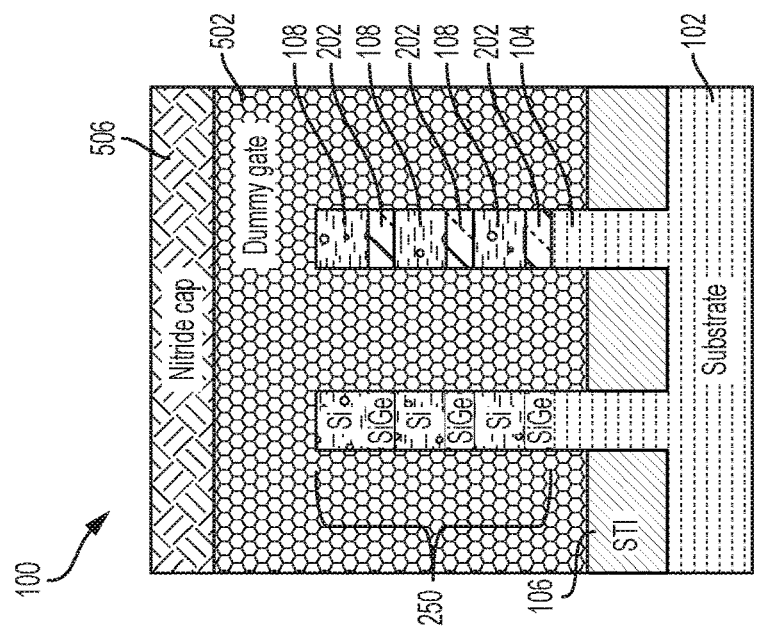
FIG. 6A depicts a cross-sectional view of the semiconductor device along line A-A of FIG. 6C according to embodiments of the invention.

FIG. 6A depicts a cross-sectional view of a semiconductor device 100 along line A-A of FIG. 6C according to embodiments of the invention. FIG. 6B depicts a cross-sectional view of the semiconductor device 100 along line B-B of FIG. 6C according to embodiments of the invention. FIG. 6C depicts a top view of the semiconductor device 100 according to embodiments of the invention. The structure shows that the stack 250 of layers 108 and 202 has been recessed in preparation to form the source and drain, thereby exposing portions of the substrate 102. Etching can be utilized to recess the nanowire layer 108 and sacrificial layer 202. An RIE etch process can be utilized to recess the stack 250. In some embodiments of the invention, the stacks 250 can be formed by a selective RIE using the dummy gate stack as a mask. RIE is a form of plasma etching in which, during etching, the surface to be etched is placed on a radio-frequency powered electrode. Moreover, during RIE, the surface to be etched takes on a potential that accelerates the etching species extracted from plasma toward the surface, in which the chemical etching reaction is taking place in the direction normal to the surface. Other examples of anisotropic etching that can be used at this point of the include ion beam etching, plasma etching, or laser ablation.

FIG. 7A depicts a cross-sectional view of a semiconductor device 100 along line A-A of FIG. 7C according to embodiments of the invention. FIG. 7B depicts a cross-sectional view of the semiconductor device 100 along line B-B of FIG. 7C according to embodiments of the invention. FIG. 7C depicts a top view of the semiconductor device 100 according to embodiments of the invention. The structure of the semiconductor device 100 has been laterally etched to recess the side portions of the sacrificial layers 202 such that gaps 702 (or empty spaces) are created. As one example, the sacrificial layers 202 can be SiGe. The sacrificial layers 202 are recessed relative to the nanowire layers 108 using a selective isotropic etch. In some embodiments of the invention, the selective isotropic etch preferentially removes silicon germanium material, leaving layers of silicon relatively untouched. The sacrificial layers 202 can be laterally etched with a wet etchant or dry etchant (in a gas phase) to create the side gaps 702 in the sacrificial layers 202. As an example, hydrochloric acid (HCl) can be used to laterally etch SiGe sacrificial layers 202, without affecting the other materials in the stack 250 (or semiconductor device 100). The gap 702 can be about 3-4 nm in height which corresponds to (e.g., is the same as) the thickness of the portions of the sacrificial layer 202 (e.g., 3-4 nm thick) that have been removed. The gaps 702 are spaces above and/or below sides of the nanowires 108. The wet etch process selectively removes the sacrificial layers 202 depending on the materials forming the nanowire layers 108 and sacrificial layers 202. The wet etch process can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 8C:
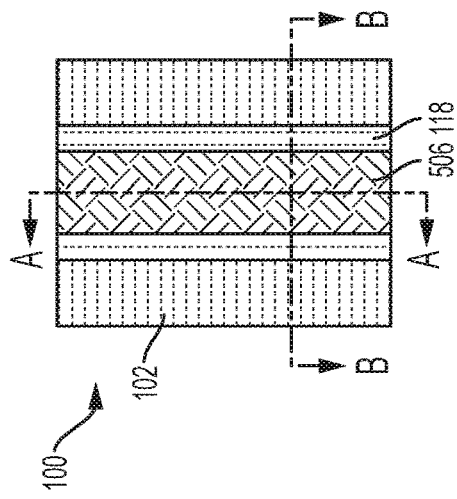
FIG. 8C depicts a top view of the semiconductor device according to embodiments of the invention.
Figure 8B:
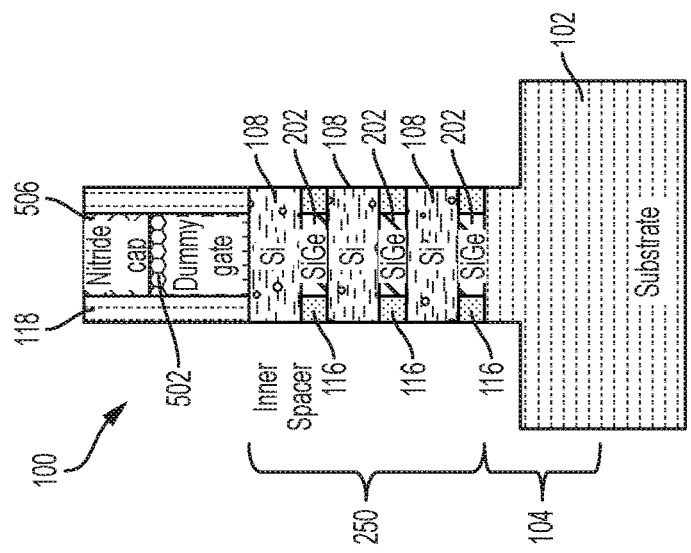
FIG. 8B depicts a cross-sectional view of the semiconductor device along line B-B of FIG. 8C according to embodiments of the invention.
Figure 8A:
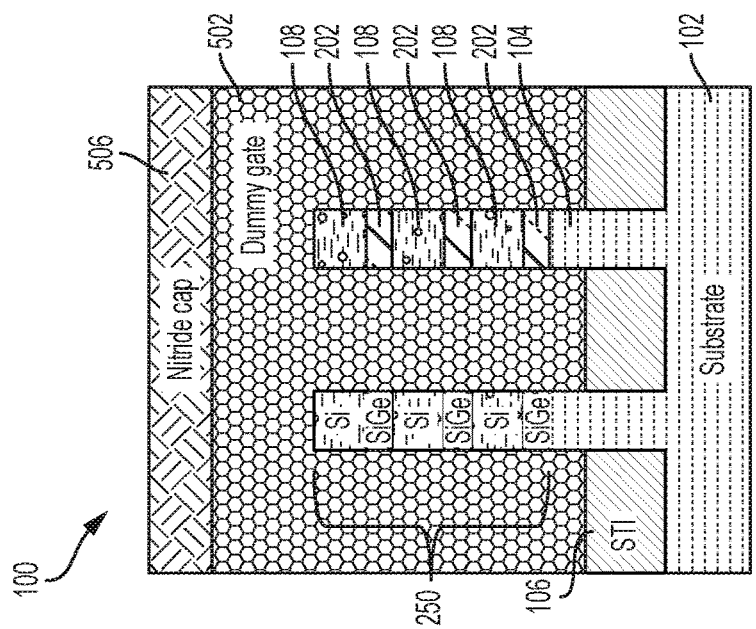
FIG. 8A depicts a cross-sectional view of the semiconductor device along line A-A of FIG. 8C according to embodiments of the invention.

FIG. 8A depicts a cross-sectional view of a semiconductor device 100 along line A-A of FIG. 8C according to embodiments of the invention. FIG. 8B depicts a cross-sectional view of the semiconductor device 100 along line B-B of FIG. 8C according to embodiments of the invention. FIG. 8C depicts a top view of the semiconductor device 100 according to embodiments of the invention. After creating the gaps 702, inner spacer material can be conformally deposited to form inner spacer 116 on the sides of the sacrificial layers 202. The inner spacer material is a low-k dielectric material. Examples of the low-k dielectric material of the inner spacer 116 include low-k dielectric materials have a k value less than 5. The low-k dielectric material that forms the inner spacer 116 can include silicon oxide, silicon nitride, boron nitride, silicon oxynitride, SiBCN, SiOCN, SiCN, SiCO, or a combination thereof. The inner spacer 116 is deposited above and below the nanowire 108 filing in the gaps 702. Directional RIE is performed to laterally recess the inner spacer material to therefore form the inner spacers 116 aligned under the nanowires 108 and on the sides of the sacrificial layers 202. Furthermore, the inner spacer 116 can be deposited using, e.g., a conformal deposition process and subsequently anisotropically etched back to remove excess spacer material on the vertical sidewalls of the nanosheet stack structure 250 and on the surface of the semiconductor substrate 102, with the inner spacer 116 being protected by the dummy gate stack above it. The spacer material deposition process includes, for example, ALD, PVD, CVD, or other like processes.

Figure 9C:
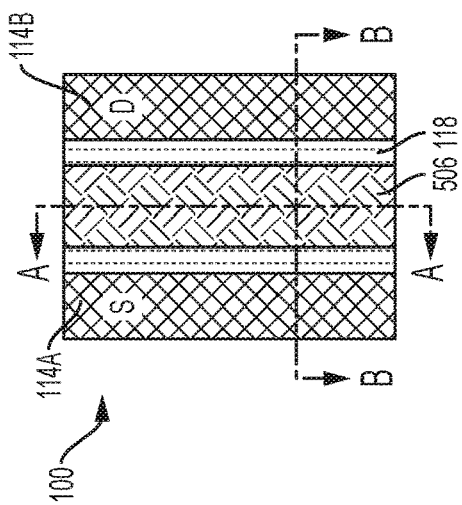
FIG. 9C depicts a top view of the semiconductor device according to embodiments of the invention.
Figure 9B:
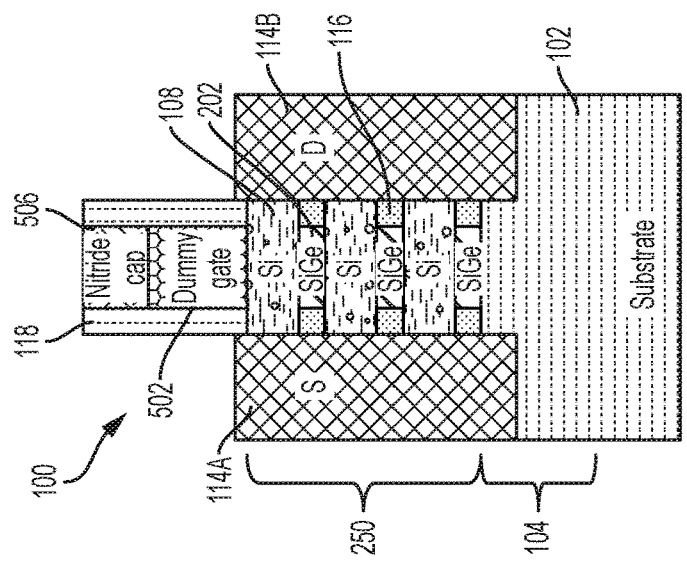
FIG. 9B depicts a cross-sectional view of the semiconductor device along line B-B of FIG. 9C according to embodiments of the invention.
Figure 9A:
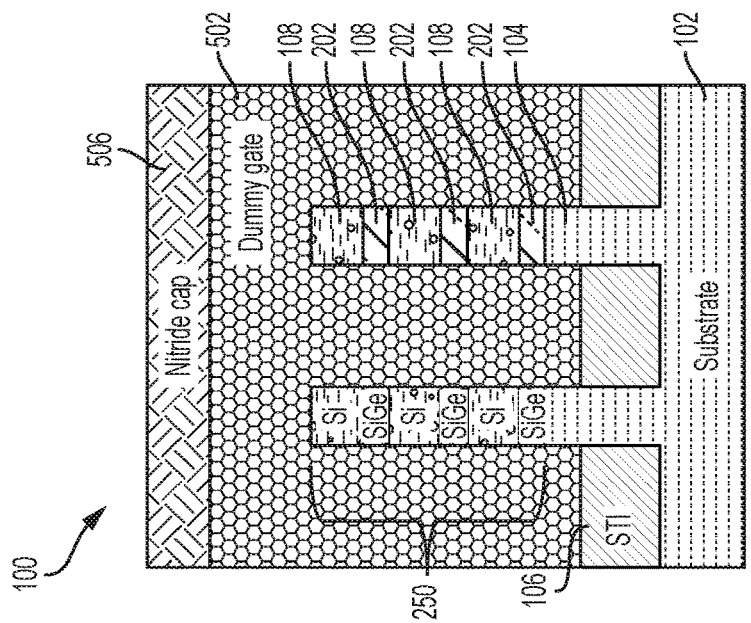
FIG. 9A depicts a cross-sectional view of the semiconductor device along line A-A of FIG. 9C according to embodiments of the invention.

FIG. 9A depicts a cross-sectional view of a semiconductor device 100 along line A-A of FIG. 9C according to embodiments of the invention. FIG. 9B depicts a cross-sectional view of the semiconductor device 100 along line B-B of FIG. 9C according to embodiments of the invention. FIG. 9C depicts a top view of the semiconductor device 100 according to embodiments of the invention. The structure of the semiconductor device 100 illustrates that source/drain material of source 114A and drain 114B is epitaxially grown on exposed portions of the substrate 102. The source 114A and drain 114B can be grown up to lower edges of the spacer 118, and/or can be recessed down to the lower edges of the spacer 118. The source 114A and drain 114B can be doped as desired for n-type or p-type transistors. The source/drain can be formed, for example, by epitaxy growth. Dopants can be incorporated into the source/drain regions by, in-situ doping during epitaxy, ex-situ doping, or a combination of both. In some embodiments of the invention, in-situ boron doped SiGe is used to form source/drain of PFET and in-situ phosphorus doped Si is used for source/drain of NFET. The doping concentration in the source/drain region can range from $1E20/cm^3$ to $2E21/cm^3$, although higher or lower doping concentration can also be employed.

Figure 10C:
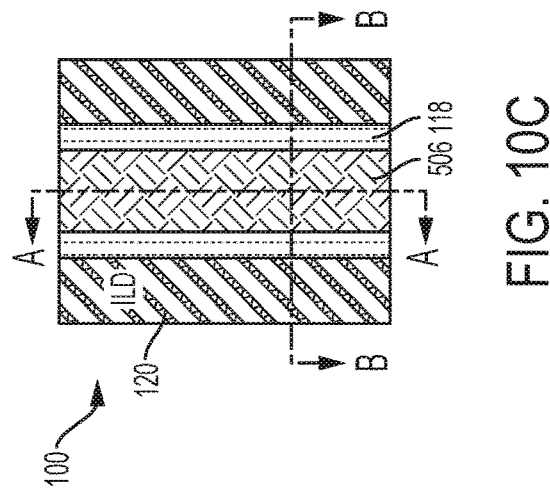
FIG. 10C depicts a top view of the semiconductor device according to embodiments of the invention.
Figure 10B:
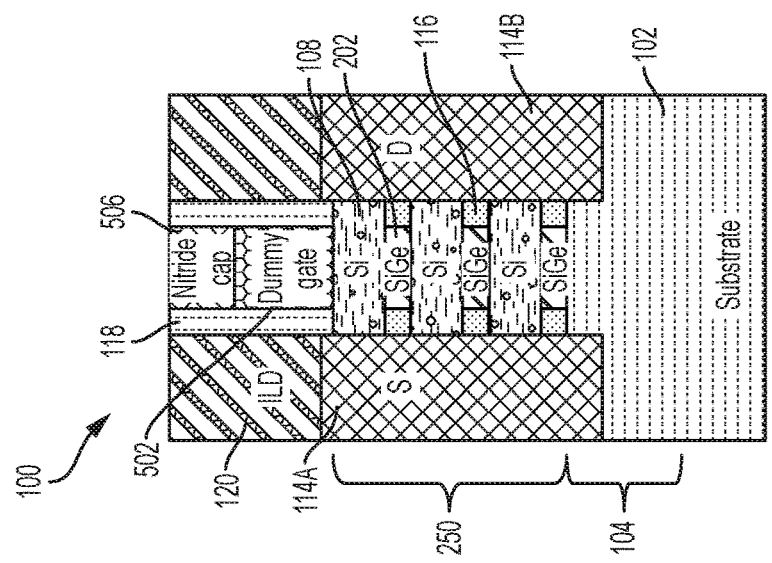
FIG. 10B depicts a cross-sectional view of the semiconductor device along line B-B of FIG. 10C according to embodiments of the invention.
Figure 10A:
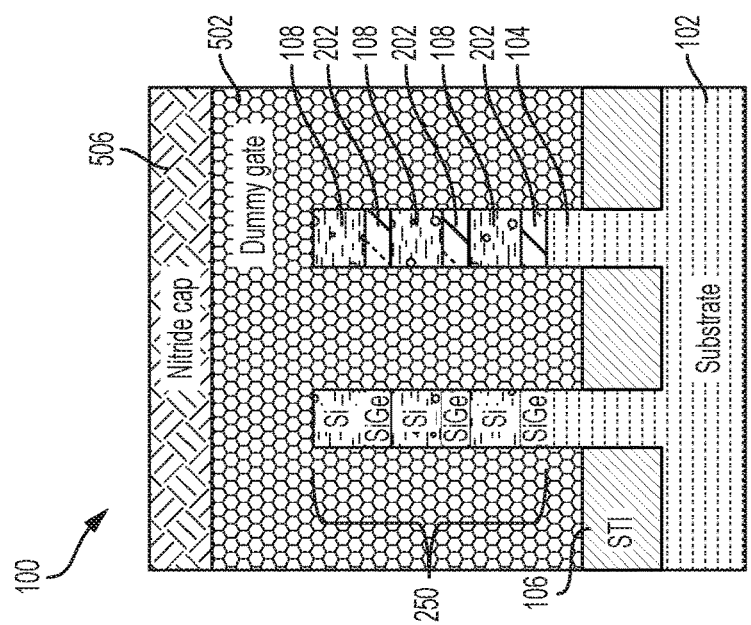
FIG. 10A depicts a cross-sectional view of the semiconductor device along line A-A of FIG. 10C according to embodiments of the invention.

FIG. 10A depicts a cross-sectional view of a semiconductor device 100 along line A-A of FIG. 10C according to embodiments of the invention. FIG. 10B depicts a cross-sectional view of the semiconductor device 100 along line B-B of FIG. 10C according to embodiments of the invention. FIG. 10C depicts a top view of the semiconductor device 100 according to embodiments of the invention. The inter-layer dielectric layer 120 is formed on top of the semiconductor device 100. Inter-layer dielectric material is deposited on top of the source 114A and drain 114B, and CMP is performed to stop of the gate hardmask 506 (e.g., a nitride cap).

Figure 11C:
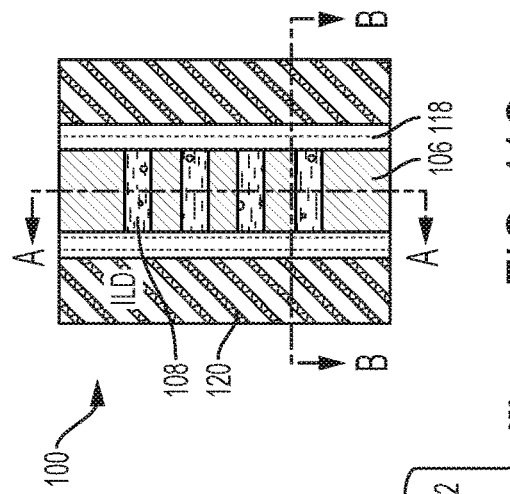
FIG. 11C depicts a top view of the semiconductor device according to embodiments of the invention.
Figure 11B:
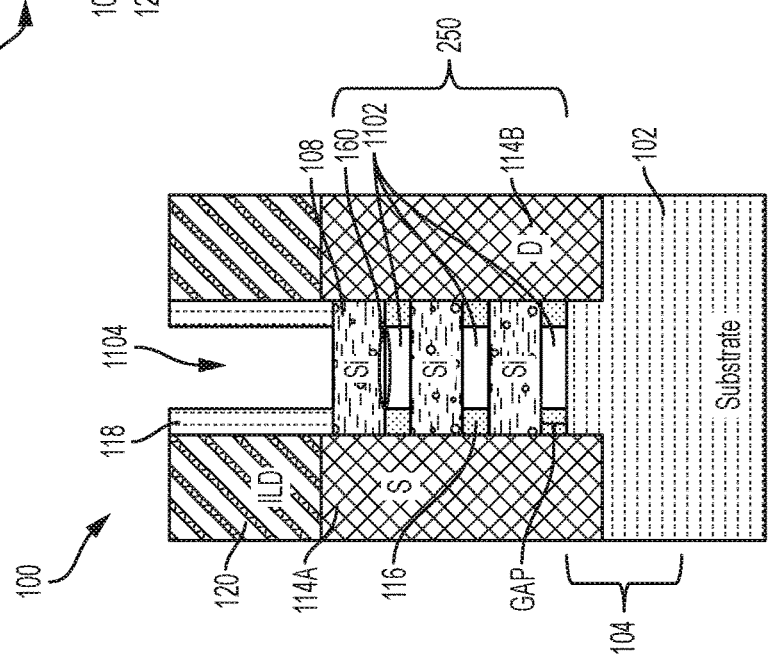
FIG. 11B depicts a cross-sectional view of the semiconductor device along line B-B of FIG. 11C according to embodiments of the invention.
Figure 11A:
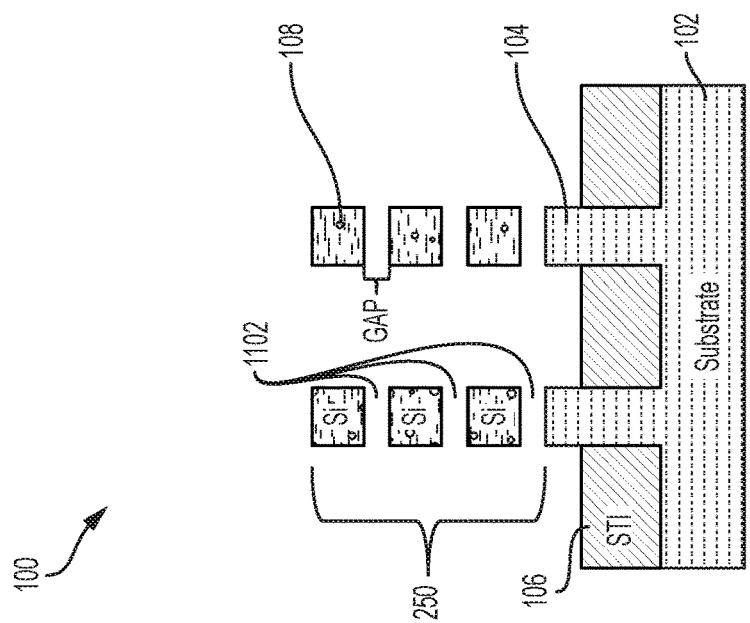
FIG. 11A depicts a cross-sectional view of the semiconductor device along line A-A of FIG. 11C according to embodiments of the invention.

FIG. 11A depicts a cross-sectional view of a semiconductor device 100 along line A-A of FIG. 11C according to embodiments of the invention. FIG. 11B depicts a cross-sectional view of the semiconductor device 100 along line B-B of FIG. 11C according to embodiments of the invention. FIG. 11C depicts a top view of the semiconductor device 100 according to embodiments of the invention. The structure of the semiconductor device 100 illustrates formation of spaces/gaps 1102 and trench 1104 in preparation for deposition of the high-k dielectric material 110. The gate hardmask 506 is removed to expose the dummy gate 502. The dummy gate 502 is removed to expose the sacrificial layers 202. Removal of the gate hardmask 506 and dummy gate 502 create trench 1104. The sacrificial layers 202 are removed to create the spaces/gaps 1102. The spaces/gaps 1102 are between the nanowires 108 and between inner spacers 116. The bottom spacer/gap 1102 is between the cap layer bottom nanowire 108 and the fin 104. In forming the spaces/gaps, remaining portions of the sacrificial layers 202 can be removed by performing a selective wet etch process, and the wet etchant can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 12C:
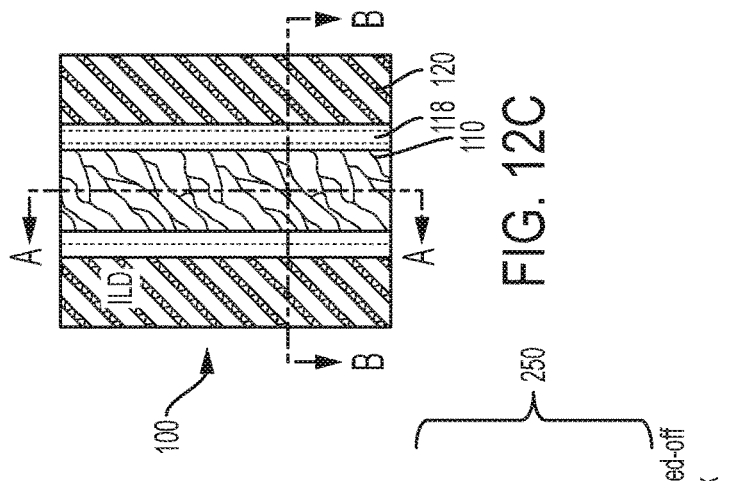
FIG. 12C depicts a top view of the semiconductor device according to embodiments of the invention.
Figure 12B:
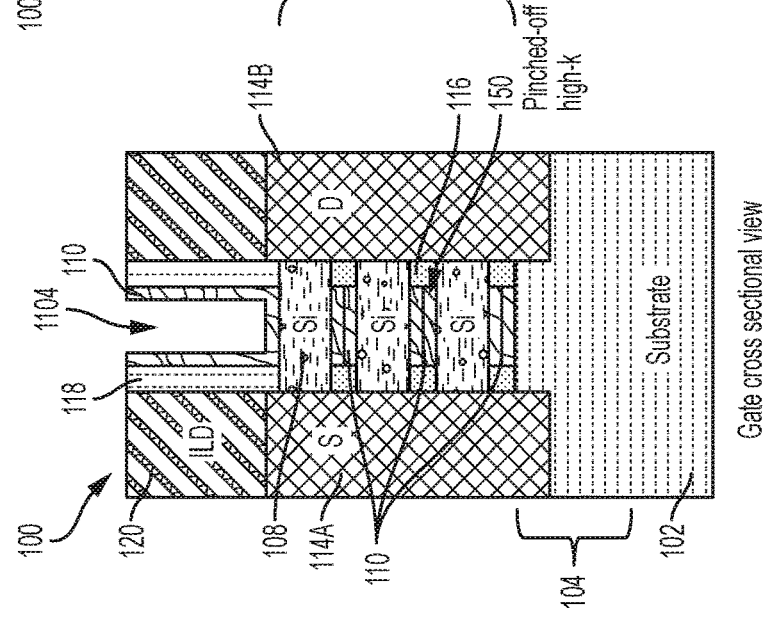
FIG. 12B depicts a cross-sectional view of the semiconductor device along line B-B of FIG. 12C according to embodiments of the invention.
Figure 12A:
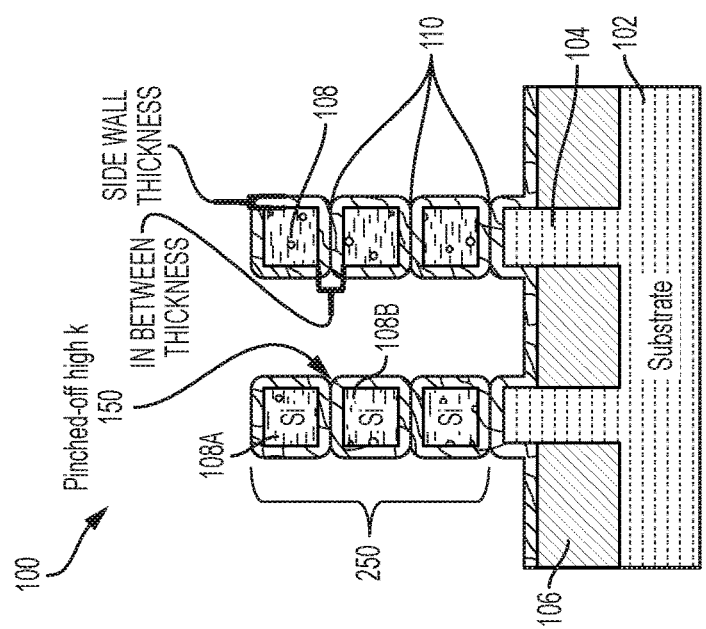
FIG. 12A depicts a cross-sectional view of the semiconductor device along line A-A of FIG. 12C according to embodiments of the invention.

FIG. 12A depicts a cross-sectional view of a semiconductor device 100 along line A-A of FIG. 12C according to embodiments of the invention. FIG. 12B depicts a cross-sectional view of the semiconductor device 100 along line B-B of FIG. 12C according to embodiments of the invention. FIG. 12C depicts a top view of the semiconductor device 100 according to embodiments of the invention. The structure of the semiconductor device 100 illustrates formation of the high-k dielectric material 110 in the spaces/gaps 1102 and trench 1104. The high-k dielectric material 110 is deposited, for example, to be pinched off as depicted by pinch off 150. The deposited high-k dielectric material 110 is formed to automatically pinch off because the gap 1102 is smaller than twice (2 times) the height/thickness of the high-k dielectric material 110. For explanation purposes, it is assumed that the gap 1102 has a height of less than 4 nm (e.g., 3.5 nm or 3.8 nm), and the high-k dielectric material 110 has a height of 2 nm on the top and bottom of each nanowire 108. Nanowire 108A and nanowire 108B are identified to further illustrate pinch off 150. As can be seen, approximately 2 nm of high-k dielectric material 110 is formed on the top and bottom of nanowire 108A, and likewise, approximately 2 nm of high-k dielectric material 110 is formed on the top and bottom of nanowire 108B. The previous gap 1102 between nanowires 108A and 108B is filled by about 4 nm of high-k dielectric material 110 because of the 2 nm on the bottom of nanowire 108A and the 2 nm of the top of nanowire 108B, thereby filling in the gap 1102 formed between nanowires 108A and 108B and resulting in the pinch off 150. Although the pinch off 150 is shown with a small space where the upper layer of high-k dielectric material 110 meets the lower layer of high-k dielectric material 110 while filing in the gap 1102, the pinch off 150 does not have to leave a small space. Instead, the pinch off 150 can be completely filled in and the layer of high-k dielectric material 110 is smooth from top to bottom (or vice versa) without the small space.

The high-k dielectric material 110 can be formed by conformal deposition techniques. The high-k dielectric material 110 can be formed by physical vapor deposition (PVD), chemical vapor deposition (CVD), etc. The high-k dielectric material 110 is also formed on the side walls of the spacer 118, on top of the fins 104, and on top of the STI 106. Any high-k dielectric material 110 formed on the ILD 120 can be removed by CMP. Examples of high-K materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-K material can further include a dopant such as lanthanum or aluminum.

Referring back to FIGS. 1A, 1B, 1C, the metal gate 122 is deposited and CMP is performed on the metal gate 122. The iFinFET 100 is formed with high-k dielectric pinch off 150 between segmented fins (i.e., nanowires 108). The formation process is compatible with a standard CMOS flow, thereby making formation of the semiconductor device 100 capable of being made within the tolerances of standard lithography techniques and procedures.

FIG. 13 is a flow chart 1300 of a method of fabricating a semiconductor device 100 (iFinFET) according to embodiments of the invention. At block 1302, the flow includes forming a stack 250 having two or more nanowires 108 separated by a high-k dielectric material 110, where the high-k dielectric material 110 is formed on at least a center portion 160 of the two or more nanowires 108 in the stack 250, where a separation space (gap 1102) in between the two or more nanowires 108 is less than (<) two times (2X) a thickness of the high-k dielectric material 110 formed on a side wall of the two or more nanowires 108. For example, as noted above removal of the sacrificial layer 202 leaves a gap 1102. Nanowire layers 108A and 108B are adjacent and are separated by the same gap 1102. If 2 nm of high-k dielectric material 110 is deposited, this results in 2 nm of high-k dielectric material 110 on top, sides (i.e., side walls), and bottom of, for example, nanowire layer 108A. Likewise, depositing 2 nm of high-k dielectric material results in 2 nm of high-k dielectric material 110 on top, sides, and bottom of, for example, nanowire layer 108B. Because thickness of each sacrificial layer 202 which now leaves gap 1102 is less than 2·2=4 nm, the 2 nm of high-k dielectric material 110 on the bottom of nanowire 108A and on the top of nanowire 108B combines in the gap 1102 left behind by sacrificial layer 202, and this combination of 4 nm of high-k dielectric material 110 is pinched off (i.e., pinch off 150) outside of the gap 1102 because the gap, in this example, is less than 4 nm. Similarly, a thickness of the high-k dielectric material 110 formed between the two or more nanowires 108 (e.g., depicted in FIG. 12A as thickness in between nanowires 108) is less (<) than two times (2X) a second thickness of the high-k dielectric material 110 formed on sides of the two or more nanowires 108 (e.g., depicted as sidewall thickness in FIG. 12A).

At block 1304, the flow includes forming a source/drain 114A and 114B on sides of the stack 250. At block 1306, the flow includes forming an inner spacer 116 to separate the source/drain 114A, 114B from the high-k dielectric material 110 in the stack 250.

The high-k dielectric material 110 is continuous between the two or more nanowires 108 at least at the center portion 160 of the two or more nanowires 108. The high-k dielectric material 110 is continuous between the two or more nanowires 108 at least at the center portion 160 of the two or more nanowires 108 defines the high-k dielectric material 110 being in direct contact with an upper nanowire 108A and a bottom nanowire 108B of the two or more nanowires.

The stack 250 comprises an inner spacer 116. The inner spacer 116 is formed on side portions of the high-k dielectric material 110 in the stack 250. The source/drain 114A and 114B is adjacent to the inner spacer 116 formed on the side portions of the high-k dielectric material 110. The flow includes forming a metal gate 122 on a top one of the two or more nanowires 108.

The high-k dielectric material 110 is formed on top of a top one of the two or more nanowires 108 and a metal gate 122 is formed on top of the top one of the two or more nanowires 108, as depicted in FIG. 1B. The inner spacer 116 separates the high-k dielectric material 110 in the stack 250 from the source/drain 114A and 114B on sides of the stack 250.

Figure 14A:
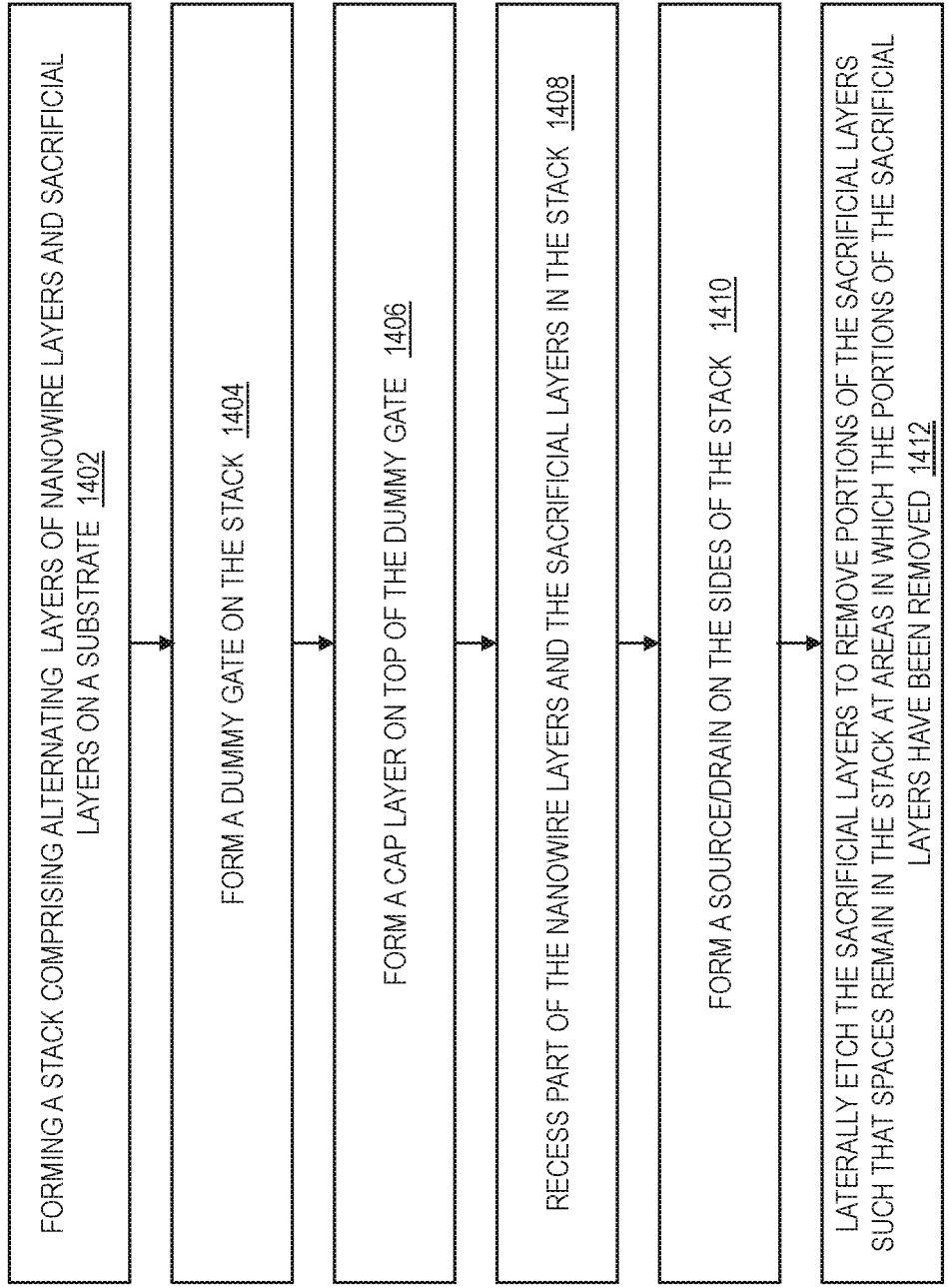
FIG. 14A depicts a flow chart of a method of fabricating a semiconductor device according to embodiments of the invention.
Figure 14B:
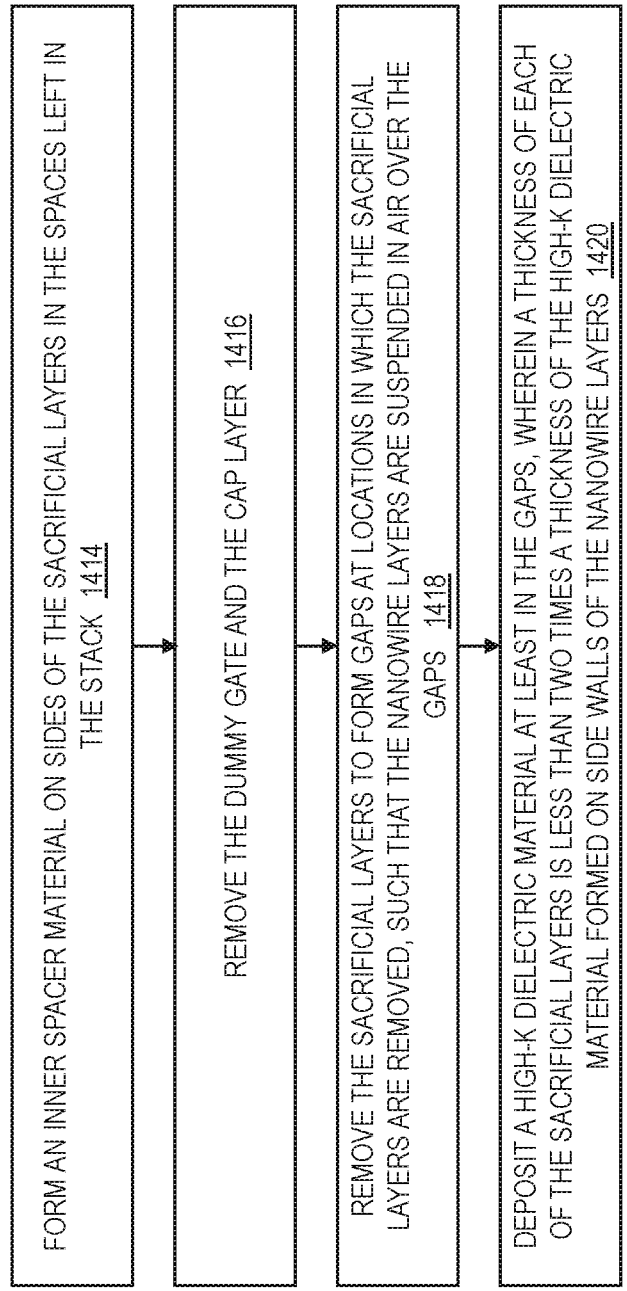
FIG. 14B depicts a continuation of the flow chart in FIG. 14A for the method of fabricating a semiconductor device according to embodiments of the invention.

FIGS. 14A and 14B depict a flow chart 1400 of a method of fabricating a semiconductor device 100 (e.g., iFinFET) according to embodiments of the invention. The flow includes forming a stack 250 having alternating layers of nanowire layers 108 and sacrificial layers 202 on a substrate 102 at block 1402, forming a dummy gate 502 on the stack 250 at block 1404, forming a cap layer 506 (gate hardmask layer) on top of the dummy gate 502 at block 1406, recessing part of the nanowire layers 108 and the sacrificial layers 202 in the stack at block 1408, and forming a source/drain 114A and 114B on the sides of the stack 250 at block 1410. Also, the flow includes laterally etching the sacrificial layers 202 to remove parts of the sacrificial layers 202 such that spaces 702 remain in the stack 250 at areas in which the parts of the sacrificial layers 202 have been removed at block 1412, and forming an inner spacer material 116 on side portions of the sacrificial layers 202 in the spaces 702 left in the stack 250 at block 1414. The flow includes removing the dummy gate 502 and the cap layer 506 at block 1416, removing the sacrificial layers 202 to form gaps 1102 at locations in which the sacrificial layers 202 are removed, such that the nanowire layers 108 are suspended in air over the gaps 1102 at block 1418 (as depicted in FIGS. 11A and 11B). The flow includes depositing a high-k dielectric material 110 at least in the gaps 1102 at block 1420, where a thickness of each of the sacrificial layers 202 (e.g., depicted in FIG. 2) is less than two times (2X) a thickness of the high-k dielectric material 110 formed on side walls of the nanowire layers 108 (as depicted in FIG. 12A). For example, as noted above removal of the sacrificial layer 202 leaves a gap 1102. Nanowire layers 108A and 108B are adjacent and are separated by the same gap 1102. If 2 nm of high-k dielectric material 110 is deposited, this results in 2 nm of high-k dielectric material 110 on top, sides, and bottom of, for example, nanowire layer 108A. Likewise, depositing 2 nm of high-k dielectric material results in 2 nm of high-k dielectric material 110 on top, sides, and bottom of, for example, nanowire layer 108B. Because thickness of each sacrificial layer 202 which now leaves gap 1102 is less than 2·2=4 nm, the 2 nm of high-k dielectric material 110 on bottom of nanowire 108A and on the top of nanowire 108B combines in the gap 1102 left behind by sacrificial layer 202, and this combination of 4 nm of high-k dielectric material 110 is pinched off (i.e., pinch off 150) outside of the gap 1102.

The high-k dielectric material is formed on top of a top one of the nanowire layers and a metal gate (not shown) is formed on top of the top one of the nanowire layers. The metal gate 122 can be formed from any appropriate conductive material including, e.g., metals such as tungsten, nickel, titanium, molybdenum, tantalum, copper, platinum, silver, gold, ruthenium, iridium, rhenium, rhodium, and alloys thereof, polysilicon, or a conducting metallic compound material such as tantalum nitride, titanium nitride, tungsten silicide, tungsten nitride, ruthenium oxide, cobalt silicide, or nickel silicide. The conductive material can further include dopants that are incorporated during or after deposition. Contacts (now shown) can be formed to provide electrical access to the metal gates and the source/drain regions 114A and 114B for operation of the transistor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a stack comprising two or more nanowires separated by a high-k dielectric material formed on a substrate having a raised portion, the high-k dielectric material being formed on at least a center portion of the two or more nanowires in the stack, wherein a separation space between the two or more nanowires is less than two times a thickness of the high-k dielectric material formed on a side wall of the two or more nanowires;
a source and a drain formed on longitudinal end surfaces of the two or more nanowires, pairs of inner spacers being formed in direct contact with the two or more nanowires such that the source and the drain are formed on opposite end surfaces of each pair of the inner spacers, a bottom surface of the source and the drain on the longitudinal end surfaces being formed below a bottom surface of a lowest most portion of the high-k dielectric material, wherein a top surface of an upper nanowire of the two or more nanowires is void of the source and the drain, wherein the raised portion of the substrate is immediately below the lowest most portion of the high-k dielectric material; and
another stack comprising two or more other nanowires separated by the high-k dielectric material formed on the substrate having another raised portion, the high-k dielectric material extending between the stack and the another stack.

2. The semiconductor device of claim 1, wherein the high-k dielectric material is continuous between the two or more nanowires at least at the center portion of the two or more nanowires.

3. The semiconductor device of claim 2, wherein the high-k dielectric material is continuous means that the high-k dielectric material is in direct contact with an upper nanowire and a bottom nanowire of the two or more nanowires and in direct contact with the pair of the inner spacers.

4. The semiconductor device of claim 1, wherein a bottom most nanowire of the two or more other nanowires and a bottom most nanowire of the two or more nanowires are connected via the high-k dielectric material extending between the stack and the another stack.

5. The semiconductor device of claim 4, wherein the inner spacers are formed on side portions of the high-k dielectric material in the stack; and
wherein the high-k dielectric material extending between the stack and the another stack comprises a thickness that is less than a thickness of the high-k dielectric material formed between the two or more nanowires.

6. The semiconductor device of claim 1 further comprising a metal gate formed on a top one of the two or more nanowires.

7. The semiconductor device of claim 1, wherein the high-k dielectric material is formed on top of a top one of the two or more nanowires.

8. The semiconductor device of claim 7, and wherein a metal gate is formed on top of the top one of the two or more nanowires.

9. The semiconductor device of claim 1, wherein the inner spacers separate the high-k dielectric material in the stack from the source and the drain on opposing sides of the stack.

10. The semiconductor device of claim 1, wherein the high-k dielectric material is pinched-off between the two or more nanowires.

11. The semiconductor device of claim 1, wherein the two or more nanowires comprise silicon.

12. The semiconductor device of claim 1, wherein the high-k dielectric material wraps around the two or more nanowires.

13. The semiconductor device of claim 1, wherein the two or more nanowires comprise dopants.

14. The semiconductor device of claim 1, wherein the two or more nanowires comprise p-type dopants.

15. The semiconductor device of claim 1, wherein the two or more nanowires comprise n-type dopants.

16. The semiconductor device of claim 1, wherein the two or more nanowires comprise p-type dopants selected from the group consisting of boron, aluminum, gallium, and indium.

17. The semiconductor device of claim 1, wherein the two or more nanowires comprise n-type dopants selected from the group consisting of phosphorus, arsenic, antimony.

18. The semiconductor device of claim 1, wherein the two or more nanowires comprise silicon carbide.

19. The semiconductor device of claim 1, wherein the two or more nanowires comprise silicon alloys.

20. The semiconductor device of claim 1, wherein:
the source and the drain are epitaxially grown material of the substrate; and
the raised portion of the substrate is in direct contact with the inner spacers.

\* \* \* \* \*